(12) United States Patent
Takeuchi et al.

(10) Patent No.: US 8,041,196 B2
(45) Date of Patent: Oct. 18, 2011

(54) HEAT RADIATING PLATE STORAGE TRAY

(75) Inventors: Kesayuki Takeuchi, Nagano (JP); Shuji Negoro, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 377 days.

(21) Appl. No.: 12/342,703

(22) Filed: Dec. 23, 2008

(65) Prior Publication Data

US 2009/0162040 A1 Jun. 25, 2009

(30) Foreign Application Priority Data

Dec. 25, 2007 (JP) ................................ 2007-332142

(51) Int. Cl.
*A21B 2/00* (2006.01)

(52) U.S. Cl. .................... 392/416; 206/711; 206/725

(58) Field of Classification Search .................. 392/416; 206/711, 725
See application file for complete search history.

(56) References Cited

U.S. PATENT DOCUMENTS

| 5,957,293 | A | * | 9/1999 | Pakeriasamy | 206/725 |
| 6,230,896 | B1 | * | 5/2001 | Lambert | 206/722 |
| 6,357,595 | B2 | * | 3/2002 | Sembonmatsu et al. | 206/726 |
| 6,612,442 | B2 | * | 9/2003 | Soh et al. | 206/725 |
| 6,868,970 | B2 | * | 3/2005 | Gardiner et al. | 206/725 |
| 7,059,476 | B2 | * | 6/2006 | Kunii et al. | 206/725 |
| 7,163,104 | B2 | * | 1/2007 | Inoke et al. | 206/726 |
| 7,458,466 | B2 | * | 12/2008 | Bjork | 206/725 |
| 7,874,434 | B2 | * | 1/2011 | Yoshizawa | 211/41.18 |
| 7,882,957 | B2 | * | 2/2011 | Ochi | 206/711 |
| 2002/0066694 | A1 | * | 6/2002 | Soh et al. | 206/725 |
| 2007/0163920 | A1 | * | 7/2007 | Sasaki | 206/725 |

FOREIGN PATENT DOCUMENTS

JP 3280421 2/2002

* cited by examiner

*Primary Examiner* — Thor Campbell
(74) *Attorney, Agent, or Firm* — Drinker Biddle & Reath LLP

(57) ABSTRACT

A heat radiating plate storage tray has a plate main body, and a plurality of first projection portions provided on a first surface of the plate main body. A heat radiating plate having a rectangular recessed portion on a surface thereof is capable of being mounted on the first surface of the plate main body, a top face of the first projection portion supports a bottom face of the recessed portion of the heat radiating plate, and a height of the first projection portion is larger than a depth of the recessed portion of the heat radiating plate.

8 Claims, 9 Drawing Sheets

HEAT RADIATING PLATE STORAGE TRAY

BACKGROUND OF THE INVENTION

1. Field of the Invention

The present invention relates to a storage tray for storing a plurality of heat radiating plates each having a rectangular recessed portion formed on a surface thereof.

2. Description of Related Art

A heat radiating plate for a semiconductor package is used by thermally connecting to a semiconductor element in order to transfer and radiate heat generated by the semiconductor element. As shown in FIG. 1, a heat radiating plate 100, which is used in a semiconductor package and includes a rectangular recessed portion on a surface thereof, is thermally connected to a semiconductor chip 200 mounted on a substrate 300 through a connecting member 400. The heat radiating plate 100 includes a flange portion 120 which is formed so as to surround the recessed portion and form an inner wall portion 150 of the recessed portion. A bottom face of the flange portion 120 is bonded and fixed to the substrate 300 via an epoxy base adhesive 500.

When transporting a large number of heat radiating plates 100 all at once before the heat radiating plates 100 are adhered to and mounted on the substrate 300 in the above-mentioned manner, a plurality of heat radiating plates 100 (not shown) are respectively mounted on their associated storage portions 62 of a storage tray 60a shown in FIG. 3. Then, as shown in FIG. 2, another storage tray 60b having the same shape as the storage tray 60a is put on the heat radiating plates 100, and the heat radiating plates 100 are transported. See Japanese Patent Examined Publication JP-B-3280421

However, while the heat radiating plates 100 are being transported in a state where they are mounted on the storage tray 60a, or while they are stored for a long time, when the flange portions 120 of the heat radiating plates 100 are contacted with the storage tray 60a for a long time, there is a possibility that ABS resin used as a material of the storage tray 60a or a component contained in an antistatic agent may adhere to the flange portions 120. When a component, for example, aliphatic amid such as amid stearate and/or a component belonging to hydrogen carbon adheres to the flange portions 120 of the heat radiating plates 100, there is raised a problem that the connecting force of the heat radiating plates 100 with the substrate 300 is decreased.

The reason for this problem is that the component adhered to the flange portions 120 of the heat radiating plates 100 deteriorates adhesive property of an epoxy-based adhesive agent which connects the flange portions 120 of the heat radiating plates 100 to the substrate 300. Also, resin contained in the storage tray includes various components which may deteriorates such adhesive property. It might be considerable to try to remove these typical harmful components, however, it has been found difficult to remove all of these harmful components.

SUMMARY OF THE INVENTION

The present invention aims to solve the above problems found in the above storage tray. Thus, it is an object of the invention to provide a heat radiating plate storage tray having a structure which, when storing a heat radiating plate, can prevent the flange portion of the heat radiating plate and the storage tray from being contacted with each other.

In order to solve the above problem, according to a first aspect of the invention, there is provided a heat radiating plate storage tray including:

a plate main body; and a plurality of first projection portions provided on a first surface of the plate main body, wherein a heat radiating plate having a rectangular recessed portion on a surface thereof is capable of being mounted on the first surface of the plate main body, a top face of the first projection portion supports a bottom face of the recessed portion of the heat radiating plate, and a height of the first projection portion is larger than a depth of the recessed portion of the heat radiating plate.

Also, according to a second aspect of the invention, it is adaptable that the four first projection portions are respectively provided at portions corresponding to four corners of the recessed portion of the radiating plate, so that the each top faces of the first projection portions supports the each corners of the radiating plate.

Further, according to a third aspect of the invention, it is adaptable that the two first projection portions are respectively provided at two portions corresponding to two sides defined between corners of the radiating plate, so that the each top faces of the first projection portions supports the each two sides including the two corners.

And, according to a fourth aspect of the invention, it is adaptable that the four first projection portions are respectively provided at four portions corresponding to four sides of the recessed portion of the radiating plate, so that the each top faces of the first projection portions supports the each sides of the radiating plate.

Also, according to a fifth aspect of the invention, it is adaptable that the first projection portion includes an extending portion which substantially extends in a direction parallel with a plane of the plate main body.

Also, according to a sixth aspect of the invention, it is adaptable that the heat radiating plate storage tray further includes four second projection portions provided on a second surface of the plate main body at positions corresponding to outer sides of outer walls of the radiating plate.

According to the invention, it is possible to provide a heat radiating plate storage tray having a structure which, while a heat radiating plate is being stored and transported, can prevent the flange portion of the heat radiating plate and the storage tray from being contacted with each other.

DETAILED DESCRIPTION OF EXEMPLARY EMBODIMENTS OF THE PRESENT INVENTION

Next, exemplary embodiments of the present invention will be described with reference to accompanying drawings.

Figure 1:
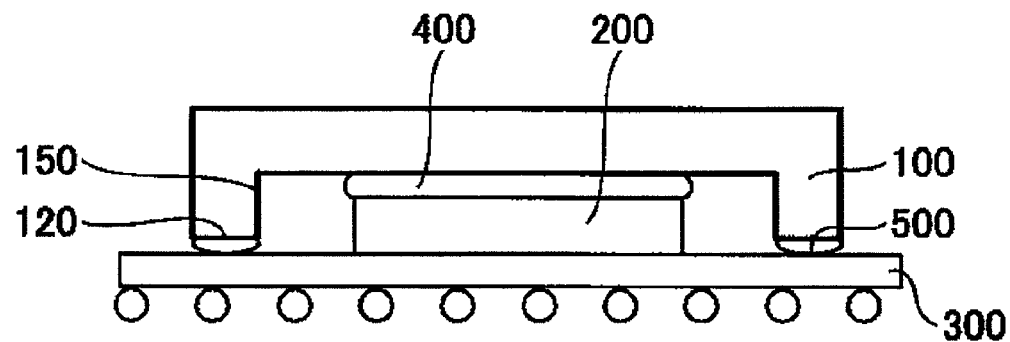
FIG. 1 is a section view of a heat radiating plate connected to a substrate on which a semiconductor element.
Figure 2:
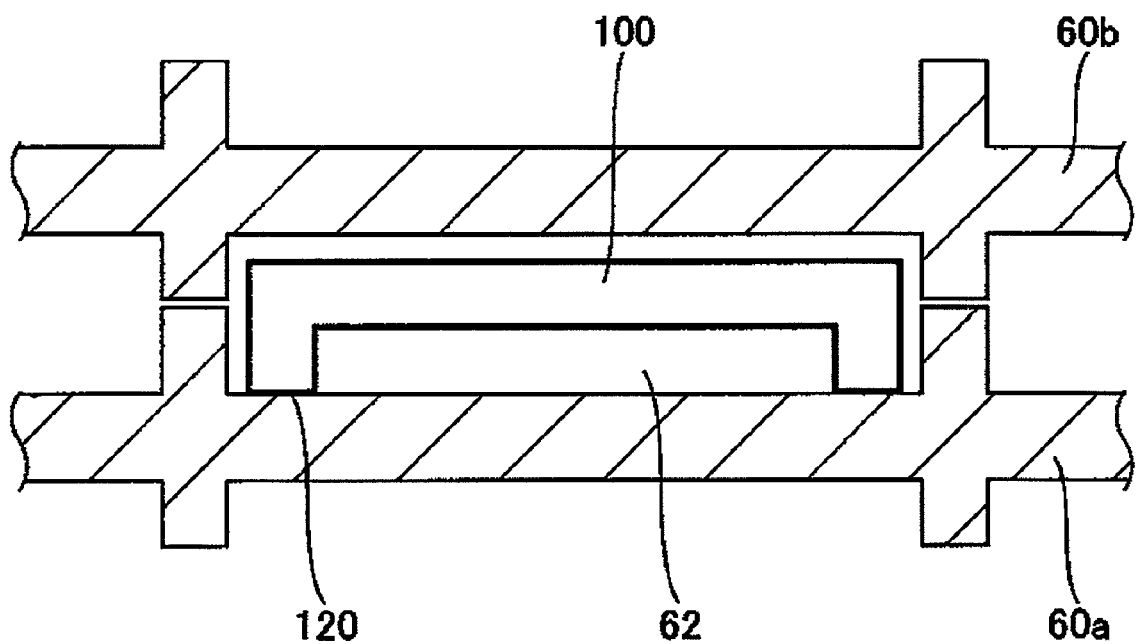
FIG. 2 is a section view of a known storage tray used to transport a heat radiating plate.
Figure 3:
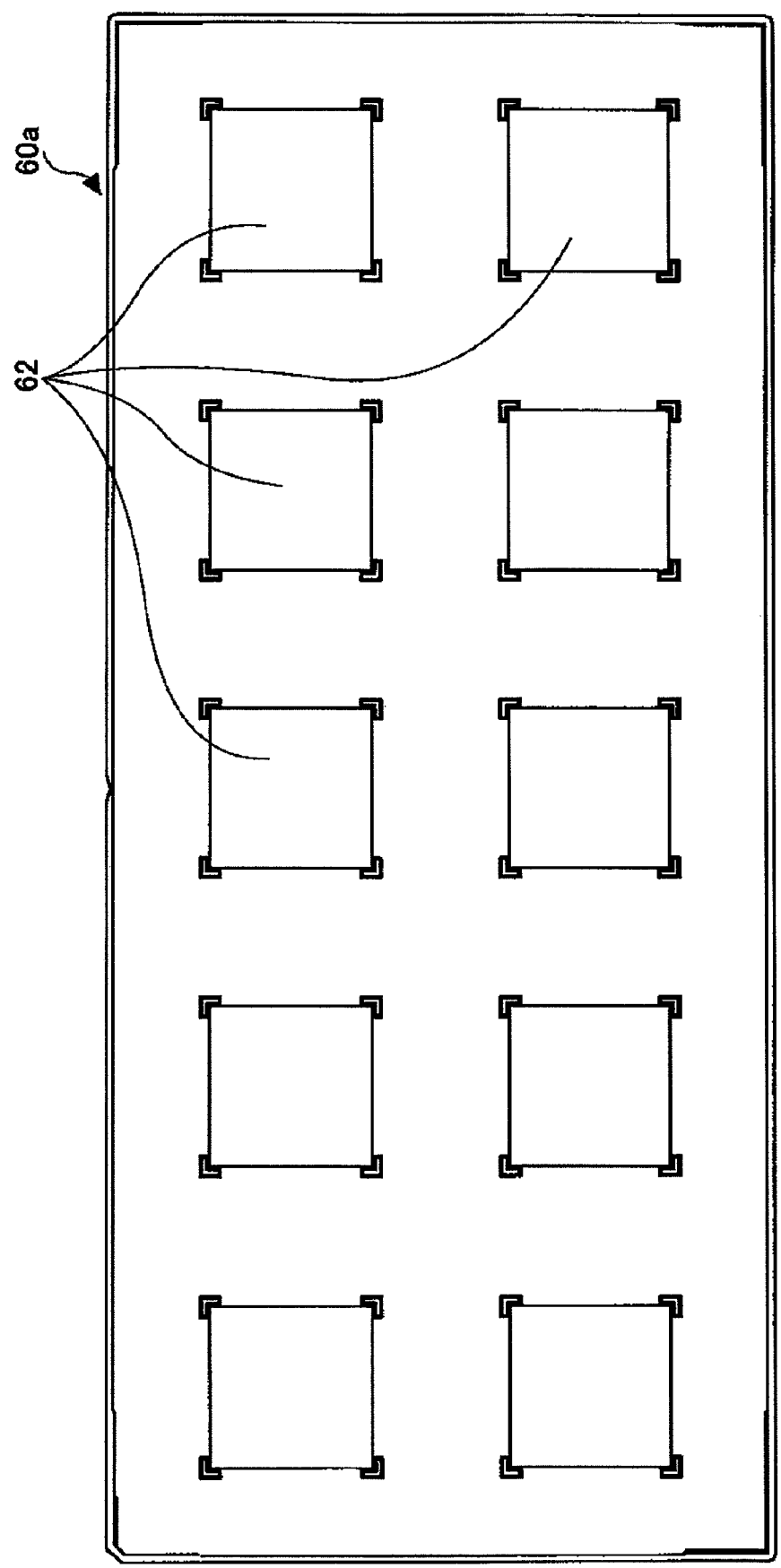
FIG. 3 is a plan view of the known storage tray used to transport a heat radiating plate.
Figure 4:
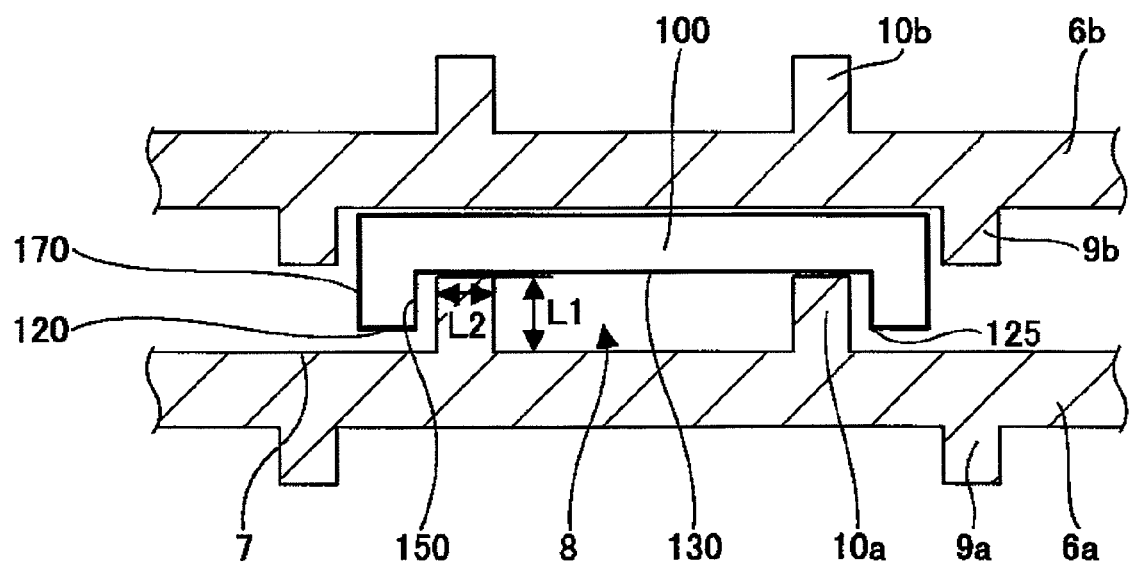
FIG. 4 is an explanatory section view of a storage tray according to the invention.

FIG. 4 is a section view to show a structure in which a heat radiating plate 100 is mounted on one of storage portions of a storage tray 6a according to the invention, and another storage tray 6b is laid on the heat radiating plate 100.

The heat radiating plate 100 shown in FIG. 4 is used to transfer and radiate the heat that is generated by a semiconductor element mounted on a substrate. For this purpose, a recessed portion 130 covering the semiconductor element is formed on a surface of the heat radiating plate 100. The recessed portion 130 of the heat radiating plate 100, as viewed from top view, is square shape or rectangular shape. In an outer periphery of the recessed portion 130, an inner wall portion 150 and an outer wall portion 170 are formed. A flange portion 120, which serves as bottom surfaces of these inside and outer wall portions 150 and 170, is used as a portion adhered to the substrate on which the semiconductor is mounted.

The heat radiating plate 100 is made of metal having a high thermal conductivity, such as aluminum or copper. As an example of the heat radiating plate 100, there is available a heat radiating plate 100 which has a square shape when viewed from above; specifically, the thickness of whole of the square heat radiating plate 100 is about 3 mm, and one side of the square may be, for example, 27 mm, or 37 mm or 48 mm. When a heat radiating plate 100 is 27 mm square shape, the recessed portion 130 of the heat radiating plate 100 roughly has a longitudinal dimension of 20 mm, a transverse dimension of 20 mm and a depth of 1 mm; and, the width of the flange portion 120 is about 3 mm.

Figure 5:
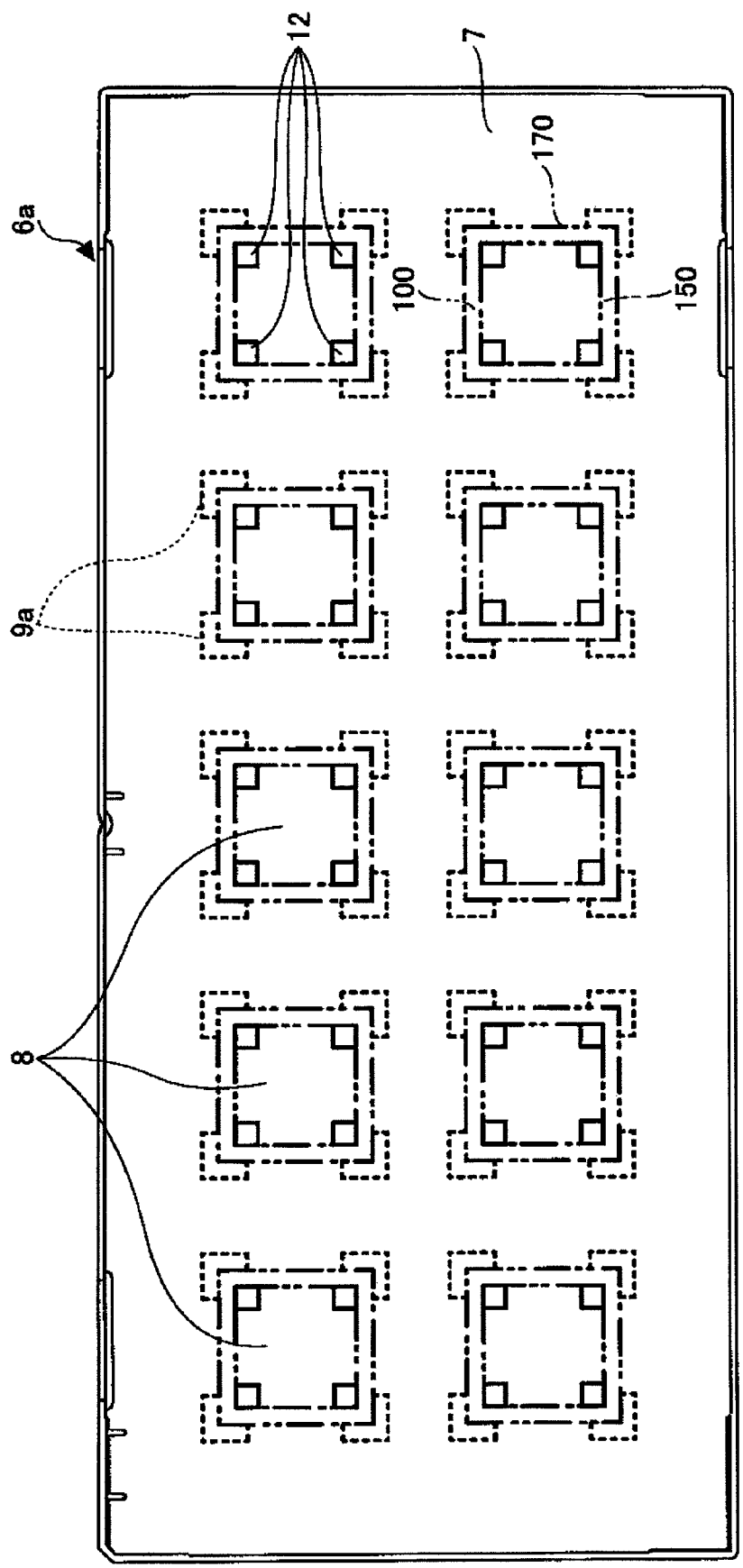
FIG. 5 is a plan view of a storage tray according to a first embodiment of the invention.

The storage tray 6a shown in FIG. 4 is made of material including ABS resin or the like and an antistatic agent or the like. Also, as shown in FIG. 5, on a surface of a plate main body of the storage tray 6a, a plurality of lattice-shaped square or rectangular storage portions 8 are formed at regular intervals. A plurality of heat radiating plates 100 are mounted on the storage portions 8, respectively. The respective storage portions 8 are identical in shape with each other.

On the storage portion 8 formed on the upper surface side of the storage tray 6a shown in FIG. 4, a plurality of projection portions 10a supporting the bottom surface of the recessed portion 130 of the heat radiating plate 100 by a top face thereof are provided. Each projection portion 10a is formed in a rectangular shape as viewed in the longitudinal sectional view.

The height L1 of the projection portion 10a is set such that, when the heat radiating plate 100 is mounted on a top face of the projection portion 10a while facing the recessed portion 130 of the heat radiating plate 100 to the projection portion 10a. That is, the height L1 is set larger than a depth of the recessed portion 130 of the heat radiating plate 100. Thus, the flange portion 120 of the heat radiating plate 100 can be prevented from touching the upper surface 7 of the storage tray 6a. For example, the height L1 of the projection portion 10a may be set in the range of about 1 mm to 3 mm. Between the flange portion 120 and upper surface 7, preferably, there may be formed a clearance of about 0.1 mm to 0.5 mm.

Also, it is preferable that a portion of the bottom surface portion of the recessed portion 130, on which the semiconductor element is mounted, does not contact with the projection portion 10a. Further, between the projection portion 10a and inner wall portion 150, a clearance is formed so that an edge portion 125 of the flange portion 120 existing on the inner wall portion 150 side is prevented from contacting with the projection portion 10a. The thus formed projection portion 10a have a width L2 of about 1 mm to 3 mm, for example.

As shown in FIG. 4, the radiating plate 100 is mounted on the storage tray 6a, another storage tray 6b is stacked on the storage tray 6a on which the radiating plate 100 has been mounted, another radiating plate 100 (not shown) is mounted on the storage tray 6b, further another storage tray 6c (not shown) is stacked thereon and thus, a group of storage trays are made. Owing to such a structure, even when transporting the heat radiating plates 100, the heat radiating plates 100 is prevented from falling off from the storage trays.

On the respective storage trays, for example, on the lower surface side (where the projection portion 10b is not provided) of the storage tray 6b, a projection portion 9b is provided. This projection portion 9b is formed so as to surround or cover the outer wall portion 170 of the heat radiating plate 100. The height of the projection portion 9b is set such that, in order to prevent the projection portion 9b from touching the flange portion 120 of the heat radiating plate 100, it is lower than the height of the outer wall portion 170. For example, the height of the projection portion 9b may be set for about 1.5 mm. Thanks to this, also when transporting the heat radiating plates 100, the respective storage trays is fixed in position so that they are prevented from shifting in position from each other.

As described above, the respective trays 6a, 6b, 6c, . . . of the storage tray group 6 structured by stacking them up on top of each other are formed identical in shape with each other, and thus they are superimposed on top of each other so as to be arranged at the same position. In this storage tray group 6, two or more storage trays can be superimposed on top of each other.

First Embodiment

FIG. 5 is a plan view of a storage tray 6a according to a first embodiment of the invention. On the storage tray 6a, ten lattice-shaped square storage portions 8 are formed at regular intervals. In each of the storage portions 8, the position of the outer wall portion 170 of the heat radiating plate 100 to be mounted and the position of the inner wall portion 150 of the recessed portion 130 of the heat radiating plate 100 are respectively shown by two-dot chained lines.

On each of the storage portions 8 formed in the upper surface of the storage tray 6a according to the present embodiment, there are erectly provided four projection portions 12 having a square or rectangular shape when it is viewed from above. The projection portions 12 are respectively shown by solid lines in FIG. 5. In other words, the four projection portions 12 are respectively provided at portions corresponding to four corners of the recessed portion 130 of the radiating plate 100, so that the each top faces of the projection portions 12 supports the each corners of the radiating plate 100.

The respective projection portions 12 are formed at positions that correspond to the four corners of the recessed portion 130 of the heat radiating plate 100. Thus, the heat radiating plate 100 is prevented from moving or inclining in the back and forth direction as well as in the right and left direction. Also, the height L1 of the respective projection portions 12 is set larger than the height of the inner wall portion 150 of the recessed portion 130 of the heat radiating plate 100. Owing to this, when the heat radiating plate 100 is mounted on the storage tray 6a, the heat radiating plate 100 is supported on the projection portion 12 so that the flange portion 120 of the heat radiating plate 100 is prevented from touching the upper surface 7 of the storage tray 6a.

On the other surface side (the lower surface side, that is, the side where the projection portion 12 is not provided) of the storage tray 6a according to the present embodiment, projection portions 9a are provided. In FIG. 5, the projection portions 9a are shown by broken lines respectively. These projection portions 9a are respectively formed to have an L shape when it is viewed from above, and are also formed at positions which surround the outer wall portion 170 of a heat radiating plate 100 to be mounted on a storage tray (not shown) that is laid on the lower side of the storage tray 6a. The positions of the projection portions 9a, which surround the outer wall portion 170 of the heat radiating plate 100, may further include a projection portion of which shape is rectangular when it is viewed from above, or the projection portions 9a may also have a frame-like shape formed so as to surround the outer wall portion 170. Owing to the thus formed projection portions 9a, when transporting the storage tray group 6 while mounting the heat radiating plates 100 thereon, the respective storage trays is fixed in position so that they are prevented from shifting in position from each other.

Second Embodiment

Figure 6:
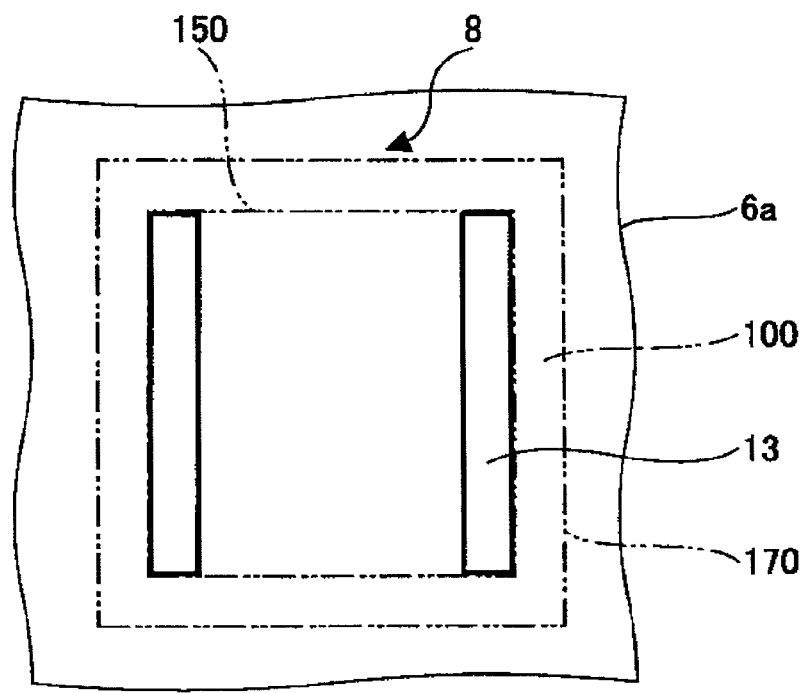
FIG. 6 is a plan view of a storage tray according to a second embodiment of the invention.

FIG. 6 is a plan view of a storage portion 8 provided on a storage tray 6a according to a second embodiment of the invention. The position of the outer wall portion 170 of the heat radiating plate 100 to be mounted on the storage tray 6a and the position of the inner wall portion 150 of the recessed portion 130 of the heat radiating plate 100 are respectively shown by two-dot chained lines. On the upper surface of the storage tray 6a according to the present embodiment, there are erectly provided two projection portions 13 each having a rectangular shape when it is viewed from above. In other words, the two projection portions 13 are respectively provided at two portions corresponding to two sides defined between corners of the radiating plate 100, so that the each top faces of the projection portions 13 supports the each two sides including the two corners.

The respective projection portions 13 are formed at positions which correspond to two sides of the recessed portion 130 of the heat radiating plate 100, whereby the heat radiating plate 100 is prevented from moving or inclining in the back and forth direction and in the right and left direction. Also, the height L1 of each projection portion 13 is set larger than the height of the inner wall portion 150 of the recessed portion 130 of the heat radiating plate 100. Owing to this, when the heat radiating plate 100 is mounted on the storage tray 6a, the heat radiating plate 100 is be supported on the projection portion 13 in such a manner that the flange portion 120 of the heat radiating plate 100 is prevented from touching the upper surface 7 of the storage tray 6a.

Third Embodiment

Figure 7:
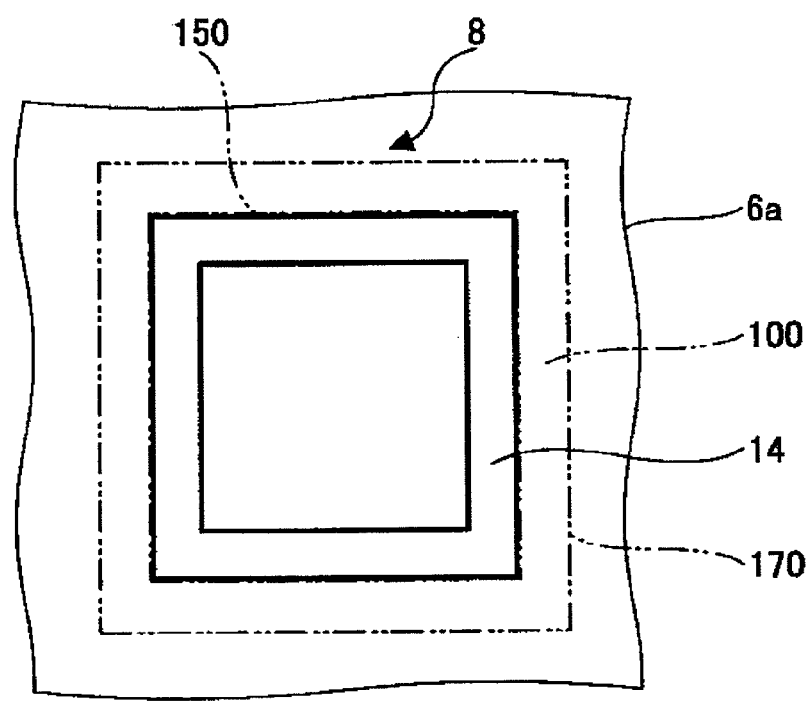
FIG. 7 is a plan view of a storage tray according to a third embodiment of the invention.

FIG. 7 is a plan view of a storage portion 8 formed on a storage tray 6a according to a third embodiment of the invention. In FIG. 7, the position of the outer wall portion 170 of a heat radiating plate 100 to be mounted on the storage tray 6a and the position of the inner wall portion 150 of the recessed portion 130 of the heat radiating plate 100 are respectively shown by two-dot chained lines. On the upper surface of the storage tray 6a according to the present embodiment, a frame-shaped projection portion 14 having a square or rectangular shape when it is viewed from above is provided, while the central portion of the projection portion 14 is opened. The projection portion 14 is formed at positions which correspond to the four sides of the recessed portion 130 of the heat radiating plate 100. This structure can prevent the heat radiating plate 100 from moving or inclining in the back and forth direction and in the right and left direction. Also, the height L1 of each projection portion 14 is set larger than the height of the inner wall portion 150 of the recessed portion 130 of the heat radiating plate 100. Owing to this, when the heat radiating plate 100 is mounted on the storage tray 6a, the heat radiating plate 100 can be supported on the projection portion 14 in such a manner that the flange portion 120 of the heat radiating plate 100 is prevented from contacting with the upper surface 7 of the heat radiating plate 100.

Fourth Embodiment

Figure 8:
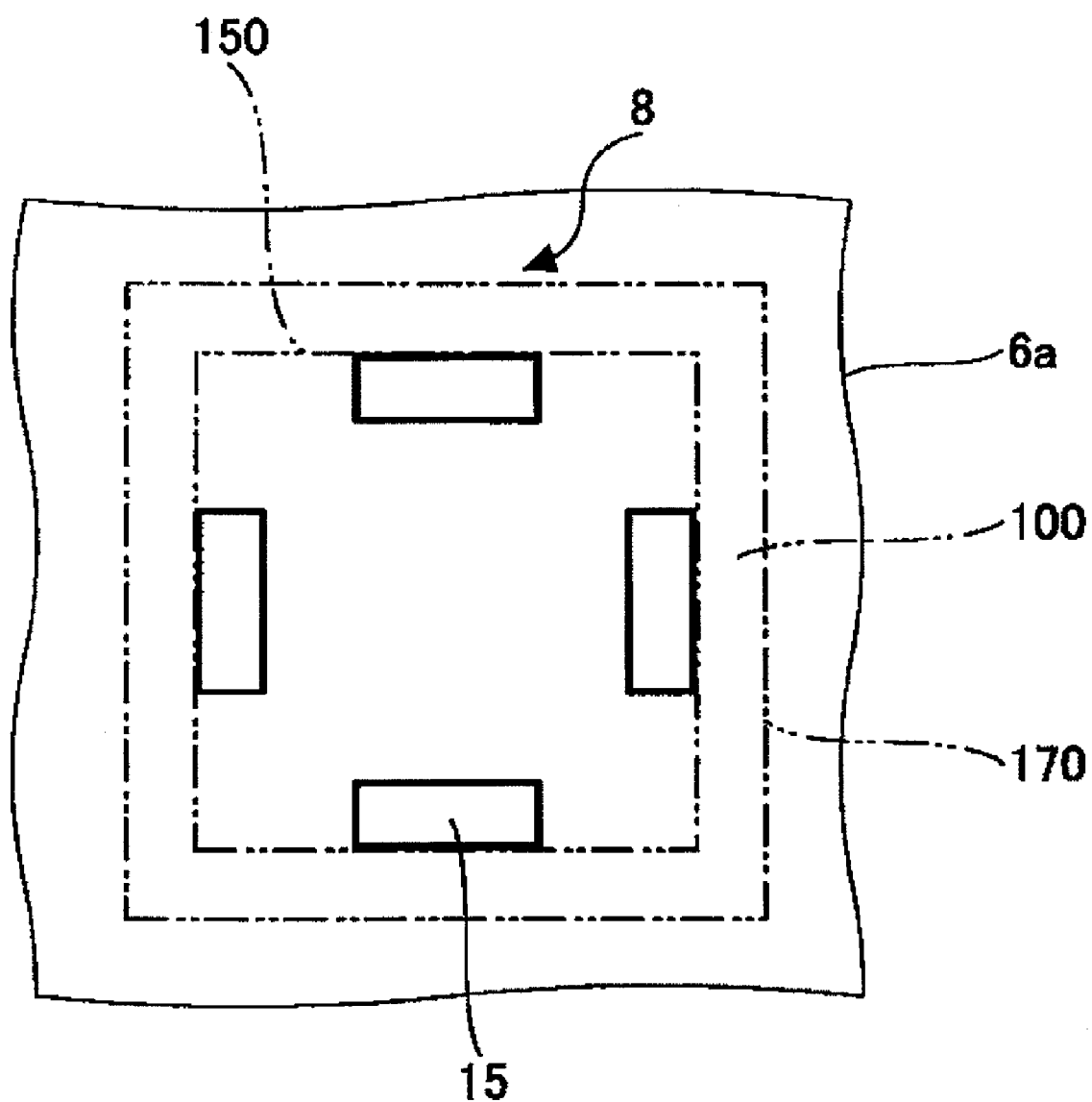
FIG. 8 is a plan view of a storage tray according to a fourth embodiment of the invention.

FIG. 8 is a plan view of a storage portion 8 formed on a storage tray according to a fourth embodiment of the invention. In FIG. 8, the position of the outer wall portion 170 of a heat radiating plate 100 to be mounted on the storage tray 6a and the position of the inner wall portion 150 of the recessed portion 130 of the heat radiating plate 100 are respectively shown by two-dot chained lines. On the upper surface of the storage tray 6a according to the present embodiment, four projection portions 15 each having a square or rectangular shape when it is viewed from above are provided.

In other words, the four projection portions 15 are respectively provided at four portions corresponding to four sides of the recessed portion 130 of the radiating plate 100, so that the each top faces of the projection portions 15 supports the each sides of the radiating plate 100.

The projection portions 15 are respectively formed at positions which correspond to their associated portions of the four sides of the recessed portion 130 of the heat radiating plate 100. This structure can prevent the heat radiating plate 100 from moving or inclining in the back and forth direction and in the right and left direction. Also, the height L1 of each projection portion 14 is set larger than the height of the inner wall portion 150 of the recessed portion 130 of the heat radiating plate 100. Owing to this, when the heat radiating plate 100 is mounted on the storage tray 6a, the heat radiating plate 100 is supported on the projection portions 15 in such a manner that the flange portion 120 of the heat radiating plate 100 is prevented from contacting with the upper surface of the heat radiating plate 100.

Fifth Embodiment

Figure 9:
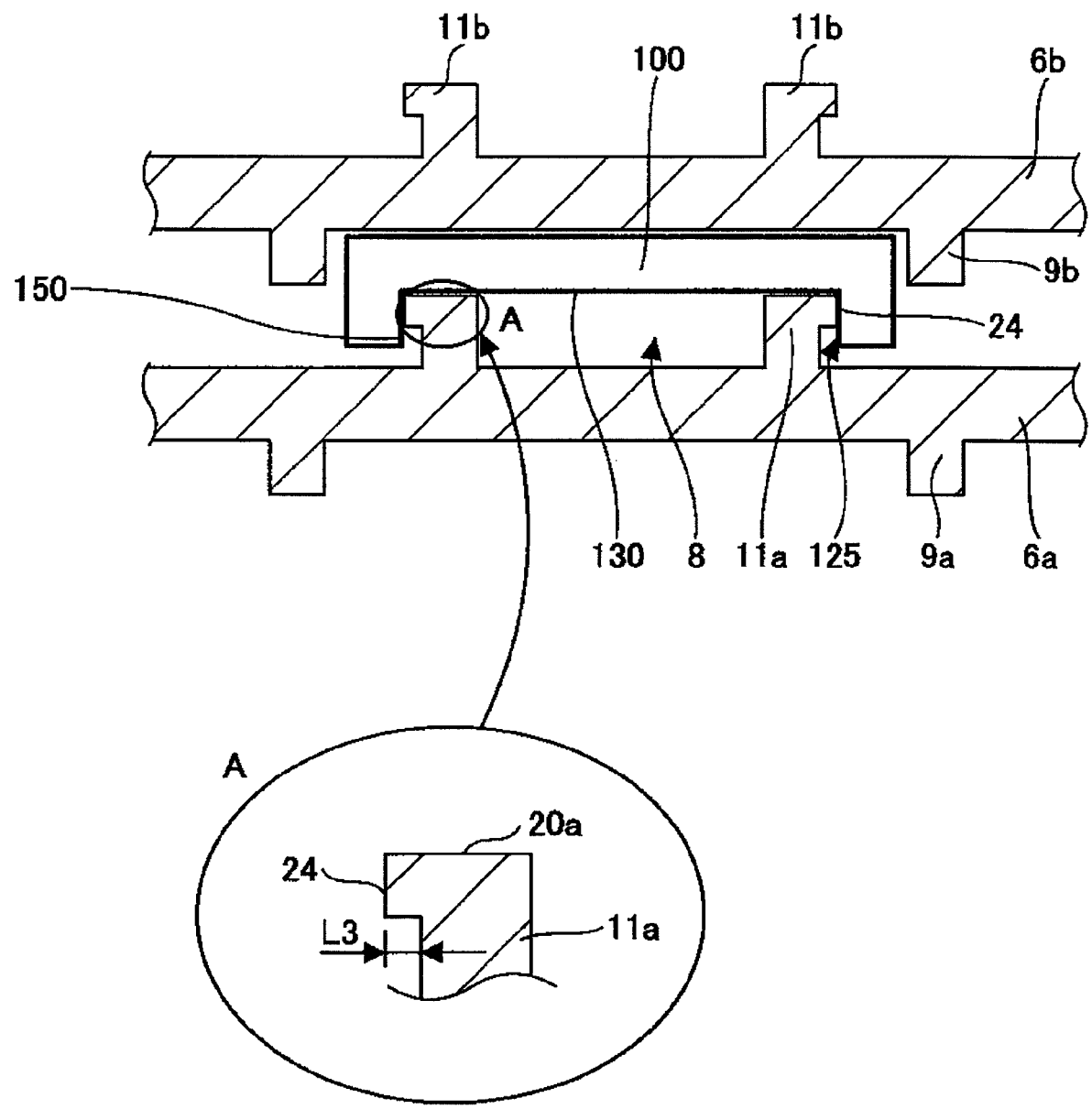
FIG. 9 is a section view of a storage tray according to a fifth embodiment of the invention.
Figure 10:
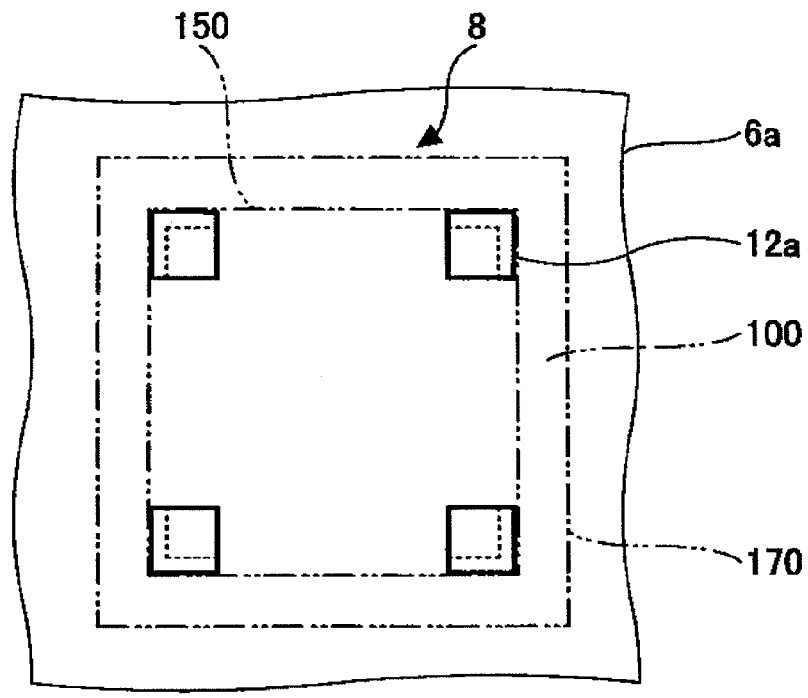
FIG. 10 is a plan view of a storage tray according to a first modification of the fifth embodiment of the invention.
Figure 11:
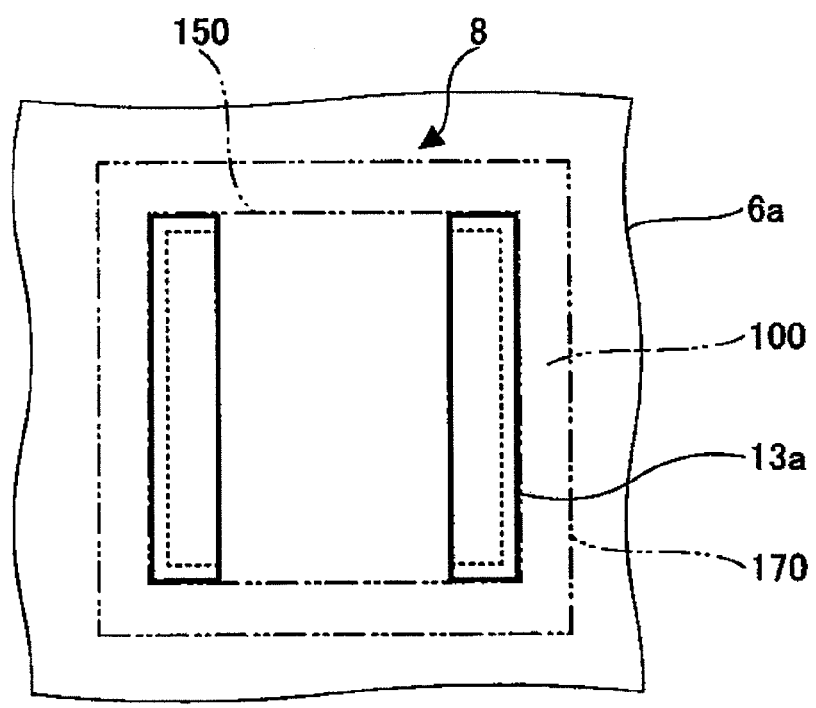
FIG. 11 is a plan view of a storage tray according to a second modification of the fifth embodiment of the invention.
Figure 12:
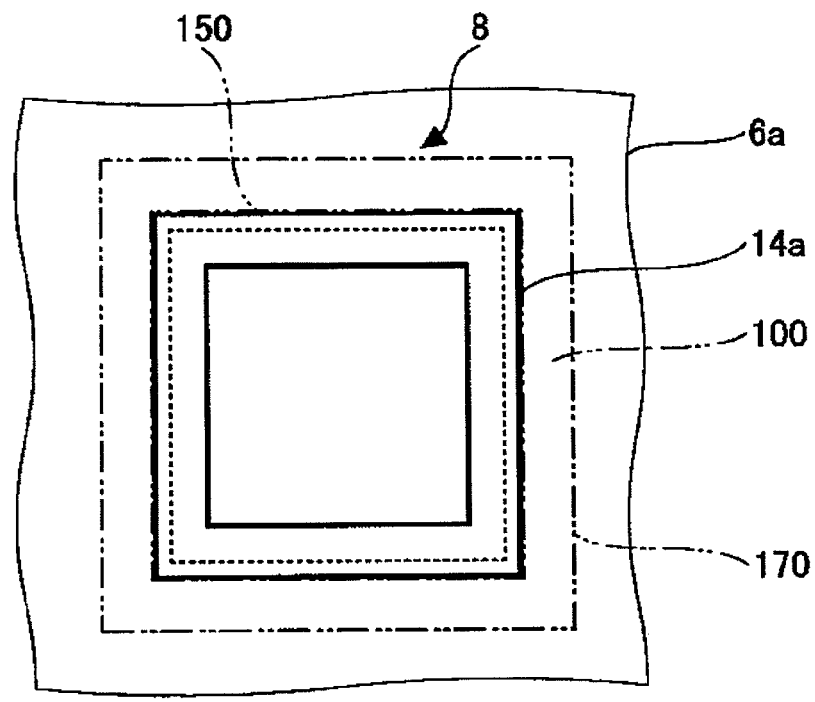
FIG. 12 is a plan view of a storage tray according to a third modification of the fifth embodiment of the invention.
Figure 13:
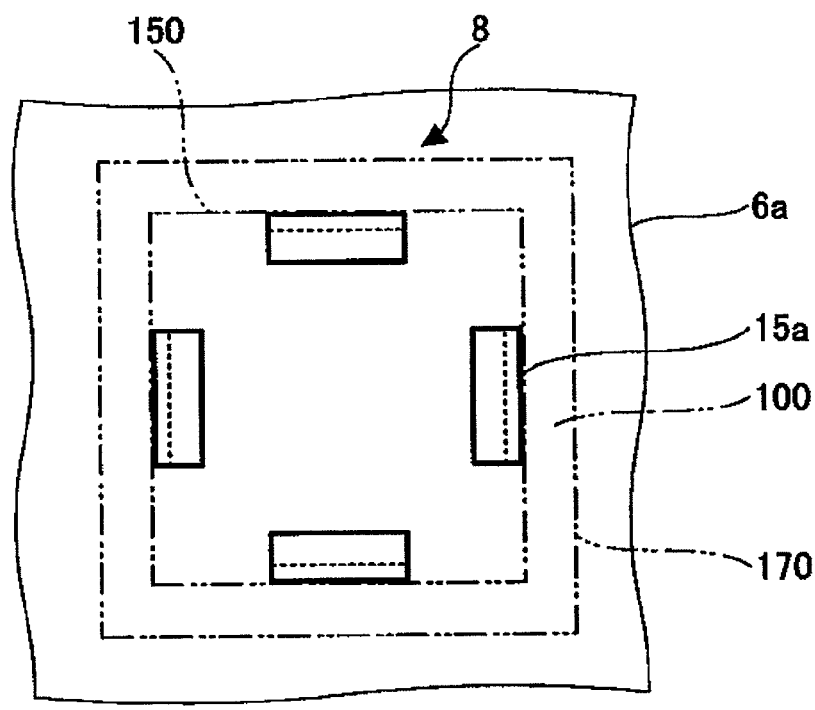
FIG. 13 is a plan view of a storage tray according to a fourth modification of the fifth embodiment of the invention.

FIG. 9 is a section view of a storage tray according to a fifth embodiment of the invention and, specifically, FIG. 9 shows a state where a heat radiating plate 100 is mounted on a storage tray 6a according to a fifth embodiment of the invention, and another storage tray 6b is laid on the heat radiating plate 100.

As shown in FIG. 9, the projection portion 11a of the storage tray 6a according to the present embodiment includes an extending portion 24 which exists on the outside of the upper portion 20a of the projection portion 11a in a direction parallel to a surface of the storage tray. The overhang length L3 of the extending portion 24 is set for a length in the range of, for example, about 0.5 mm to 1 mm, which allows the extending portion 24 to come into contact with such portion of the inner wall portion 150 as existing in the vicinity of the bottom surface of the recessed portion 130 to thereby prevent the edge portion 125 of the flange portion 120 on the inner wall portion 150 side from touching the projection portion 11a.

FIGS. 10 to 13 are respectively plan views of projection portions 12a, 13a, 14a and 15a which are respectively similar in position and shape to the projection portions employed in the above-mentioned first to fourth embodiment but are different therefrom in that extending portions 24 (in the respective figures, the boundaries thereof with respect to the projection portions 11a shown by solid lines are shown by broken lines respectively) are provided on the projection portions 12, 13, 14 and 15 respectively.

Here, the shape of whole of the heat radiating plate 100 and the shape of the plan view of the recessed portion 130 may be, besides the above-mentioned square and rectangular shape, a circular shape or a polygonal shape. For example, when the recessed portion 130 has a circular shape when it is viewed from above, the shapes of the projection portions 12~15 can be changed properly to a circular shape or a polygonal shape.

Although description has been given heretofore in detail of the preferred embodiments of the invention, the invention is not limited to the above-mentioned specific embodiments but various changes and modifications are also possible without departing from the scope of the subject matter set forth in the scope of the appended patent claims.

What is claimed is:

1. A heat radiating plate storage tray comprising:
   a plate main body;
   a plurality of first projection portions provided on a first surface of the plate main body; and
   a heat radiating plate having a rectangular recessed portion on a surface thereof mounted on the first surface of the plate main body, wherein
   a top face of each first projection portion supports a bottom face of the recessed portion of the heat radiating plate, and
   a height of each first projection portion is larger than a depth of the recessed portion of the heat radiating plate.

2. The heat radiating plate storage tray according to claim 1, wherein
   the plurality of first projection portions comprises four first projection portions that are respectively provided at portions corresponding to four corners of the recessed portion of the radiating plate, so that each top face of the first projection portions supports a respective corner of the recessed portion of the radiating plate.

3. The heat radiating plate storage tray according to claim 1, wherein
   the plurality of first projection portions comprises two first projection portions that are respectively provided at two portions corresponding to two sides defined between corners of the radiating plate, so that each top face of the first projection portions supports a respective side defined between the corners.

4. The heat radiating plate storage tray according to claim 1, wherein
   the plurality of first projection portions comprises four first projection portions that are respectively provided at four portions corresponding to four sides of the recessed portion of the radiating plate, so that each top face of the first projection portions supports a respective side of the recessed portion of the radiating plate.

5. The heat radiating plate storage tray according to claim 1, wherein the first projection portion comprises an extending portion which substantially extends in a direction parallel with a plane of the plate main body.

6. The heat radiating plate storage tray according to claim 1, further comprising:
   second projection portions provided on a second surface of the plate main body at positions corresponding to outer sides of outer walls of the radiating plate.

7. The heat radiating plate storage tray according to claim 6, wherein a height of each of the second projection portions is smaller than a height of the outer walls of the heat radiating plate.

8. The heat radiating plate storage tray according to claim 6, comprising:
   a first heat radiating plate storage tray; and
   a second heat radiating plate storage tray,
   wherein the second heat radiating plate storage tray is stacked on the first heat radiating plate storage tray such that the second surface of the plate main body of the second heat radiating plate storage tray contacts the heat radiating plate of the first heat radiating plate storage tray while the second projection portions of the second heat radiating plate storage tray do not contact the first surface of the plate main body of the first heat radiating plate storage tray.

* * * * *